US009866243B2

(12) United States Patent
Sun

(10) Patent No.: US 9,866,243 B2
(45) Date of Patent: Jan. 9, 2018

(54) FORWARD ERROR CORRECTION CODEWORD SYNCHRONIZATION METHOD, DEVICE, AND SYSTEM

(71) Applicant: Huawei Technologies Co., Ltd., Shenzhen, Guangdong (CN)

(72) Inventor: Fanglin Sun, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 219 days.

(21) Appl. No.: 14/836,597

(22) Filed: Aug. 26, 2015

(65) Prior Publication Data

US 2015/0365109 A1 Dec. 17, 2015

Related U.S. Application Data

(63) Continuation of application No. PCT/CN2013/072088, filed on Mar. 1, 2013.

(51) Int. Cl.
*H03M 13/33* (2006.01)
*H04L 1/00* (2006.01)
(Continued)

(52) U.S. Cl.
CPC .......... *H03M 13/33* (2013.01); *H03M 13/11* (2013.01); *H03M 13/611* (2013.01);
(Continued)

(58) Field of Classification Search
CPC .... H03M 13/33; H03M 13/11; H03M 13/613; H03M 13/611; H03M 13/333;
(Continued)

(56) References Cited

U.S. PATENT DOCUMENTS 4,813,040 A * 3/1989 Futato ................. H04M 11/068
370/477
6,560,745 B1 * 5/2003 McCloskey ........... H03M 13/00
375/145
(Continued)

FOREIGN PATENT DOCUMENTS

CN 102468919 A 5/2012
EP 2 533 452 A1 12/2012
(Continued)

OTHER PUBLICATIONS

Y. Polyanskiy, "On asynchronous capacity and dispersion," 2012 46th Annual Conference on Information Sciences and Systems (CISS), Princeton, NJ, 2012, pp. 1-6.*

(Continued)

*Primary Examiner* — Cynthia Britt

(57) ABSTRACT

Embodiments of the present invention provide a forward error correction codeword synchronization method, device, and system. The method is: sending, by a central office device, synchronization information of an FEC codeword to a terminal device by using a management channel, where the information includes information about an agreed location of an FEC codeword, and the information about the agreed location of the first FEC codeword indicates a location that is of the first FEC codeword and is corresponding to data at an agreed location of an agreed time-frequency resource block; and receiving, by the terminal device, the synchronization information that is of the FEC codeword and is sent by the central office device, and adjusting a status parameter of an encoder or a decoder according to the information, so as to complete codeword synchronization. The embodiments of the present invention are used for FEC codeword synchronization.

15 Claims, 9 Drawing Sheets

(51) Int. Cl.
*H03M 13/11* (2006.01)
*H03M 13/00* (2006.01)
*H04L 5/00* (2006.01)

(52) U.S. Cl.
CPC ........ *H03M 13/613* (2013.01); *H04L 1/0047* (2013.01); *H04L 5/0005* (2013.01); *H04L 5/0053* (2013.01)

(58) Field of Classification Search
CPC .... H03M 13/03; H04L 5/0053; H04L 5/0005; H04L 1/0047; H04L 1/00; H04L 1/004; H04L 27/2655
See application file for complete search history.

(56) References Cited

U.S. PATENT DOCUMENTS

| | | | |
|---|---|---|---|
| 2003/0037297 A1* | 2/2003 | Araki | H04J 3/0608 714/746 |
| 2003/0207696 A1 | 11/2003 | Willenegger et al. | |
| 2004/0225946 A1* | 11/2004 | Hashimoto | G06F 11/1008 714/764 |
| 2004/0252725 A1 | 12/2004 | Sun et al. | |
| 2007/0064707 A1 | 3/2007 | Pandel et al. | |
| 2010/0322177 A1 | 12/2010 | Luo et al. | |
| 2012/0117442 A1 | 5/2012 | Lee | |
| 2014/0237323 A1 | 8/2014 | Yu et al. | |
| 2016/0087753 A1* | 3/2016 | Ran | H04L 1/0057 714/776 |

FOREIGN PATENT DOCUMENTS

| | | |
|---|---|---|
| KR | 1020080016137 A | 2/2008 |
| WO | WO 2012/163033 A1 | 12/2012 |

OTHER PUBLICATIONS

A. E. Escott and S. Perkins, "Binary Huffman equivalent codes with a short synchronizing codeword," in IEEE Transactions on Information Theory, vol. 44, No. 1, pp. 346-351, Jan. 1998.*

Yew-San Lee, Wei-Shin Chang, Hsin-Han Ho and Chen-Yi Lee, "Construction of error resilient synchronization codeword for variable-length code in image transmission," Proceedings 2000 International Conference on Image Processing (Cat. No. 00CH37101), Vancouver, BB, 2000, pp. 360-363 vol. 3.*

T. D. Robinson and D. B. Koch, "Frame synchronization using complementary codes in digital communication systems," Southeastcon '91., IEEE Proceedings of, Williamsburg, VA, 1991, pp. 847-850 vol. 2.*

"Draft Standard for Ethernet Amendment X: Physical Layer Specifications and Management Parameters for Ethernet Passive Optical Networks Protocol over Coax", IEEE P802.3bn/D1.0, Jul. 2014, 272 pages.

Ed Boyd, et al., "Framing for EPoC Continuous Downstream", IEEE 802.bn EPoC, May 2013, 12 pages.

* cited by examiner

FORWARD ERROR CORRECTION CODEWORD SYNCHRONIZATION METHOD, DEVICE, AND SYSTEM

CROSS-REFERENCE TO RELATED APPLICATIONS

This application is a continuation of International Application No. PCT/CN2013/072088, filed on Mar. 1, 2013, which is hereby incorporated by reference in its entirety.

TECHNICAL FIELD

The present invention relates to the communications field, and in particular, to a forward error correction codeword synchronization method, device, and system.

BACKGROUND

A forward error correction codeword (FEC) includes an information element and a supervision element. When decoding is performed on an FEC codeword, an input information sequence of a decoder needs to be synchronized and aligned with an output information sequence of an encoder, that is, it is required that a start location for decoding by the decoder needs to be a start location of the FEC codeword. If the start location for decoding by the decoder is not the start location of the FEC codeword, the decoder cannot identify an information element and a supervision element in the FEC codeword, and decoding cannot be performed correctly.

A common method in the prior art is adopting a manner in which an FEC codeword and a frame structure are in an absolute mapping relationship, that is, for a resource block including N symbols and M frequency resources in two dimensions, a unique mapping relationship exists between a quantity of bits that can be carried in each resource block and an FEC codeword, that is, one resource block is corresponding to one FEC codeword.

In another prior art, a synchronization header or a start identifier is added to each FEC codeword at a transmit end, that is, a synchronization field or identifier is added before each FEC codeword, and is used by a receive end to perform codeword synchronization.

In a process of implementing the foregoing FEC codeword synchronization, the inventor finds that at least the following problem exists in the prior art:

If the manner in which an FEC codeword and a frame structure are in an absolute mapping relationship is adopted, because a quantity of bits carried in a resource block may be any value, flexibility of a time-frequency resource block can be met only when a size of an FEC codeword has a quite wide dynamic range. However, higher flexibility of an FEC codeword brings more trouble. Therefore, mapping is performed on a resource block only by fixing several lengths of FEC codewords, which causes relatively low utilization of the resource block.

If a synchronization header or a start identifier is added to each FEC codeword, in a case in which a length of an FEC codeword is relatively short, or when a receiver that has made a codeword synchronized does not need to keep performing codeword synchronization, this design brings relatively more unnecessary overheads to a system. Therefore, how to reduce system overheads when FEC codeword synchronization is ensured is an urgent problem to be resolved.

SUMMARY

Embodiments of the present invention provide a forward error correction codeword synchronization method, device, and system, which can implement FEC codeword synchronization and reduce system overheads.

To achieve the foregoing objective, the following technical solutions are adopted in the embodiments of the present invention:

According to a first aspect, a forward error correction codeword synchronization method is provided, where the method includes:

receiving synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block; and resetting a status parameter of a terminal decoder according to the synchronization information of the first FEC codeword, so that the terminal decoder starts decoding from the agreed location of the first FEC codeword, or resetting a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

In a first possible implementation manner, with reference to the first aspect, the receiving synchronization information that is of a first forward error correction FEC codeword and is sent by a central office device by using a management channel includes:

after a terminal device initiates an access or registration request to the central office device, receiving the synchronization information that is of the first forward error correction FEC codeword and is sent by the central office device by using the management channel.

In a second possible implementation manner, with reference to the first possible implementation manner of the first aspect, the method further includes: when the location that is of the FEC codeword input by the terminal decoder and is corresponding to the data at the agreed location of the agreed time-frequency resource block is different from the agreed location of the first FEC codeword, that is, the FEC codeword is unsynchronized, sending a resynchronization request message to the central office device;

receiving the synchronization information that is of the first FEC codeword and is resent by the central office device by using the management channel, where the information about the agreed location of the first FEC codeword indicates a location that is of the first FEC codeword and is corresponding to data at an agreed location of an agreed time-frequency resource block; and resetting status data of the terminal encoder, so that the location that is of the FEC codeword output by the terminal encoder and is corresponding to the data at the agreed location of the agreed time-frequency resource block is the same as the agreed location of the first FEC codeword, so as to complete codeword synchronization again.

In a third possible implementation manner, with reference to the first aspect or the first or the second possible implementation manner of the first aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the first aspect or any one of the first to the third possible implementation manners of the first aspect, the receiving synchronization information that is of a first forward error correction FEC codeword and is sent by a central office device by using a management channel includes:

receiving the synchronization information that is of the first FEC codeword and is periodically sent by the central office device by using the management channel, where a period for sending the synchronization information of the first FEC codeword is an integral multiple of a frame period.

In a fifth possible implementation manner, with reference to the first aspect or any one of the first to the fourth possible implementation manners of the first aspect, the receiving synchronization information that is of a first forward error correction FEC codeword and is sent by a central office device by using a management channel includes:

receiving a resource allocation indication message sent together with the synchronization information of the first FEC codeword by the central office device by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

According to a second aspect, a forward error correction codeword synchronization method is provided, where based on a central office device, the method includes:

sending synchronization information of a first forward error correction FEC codeword to the terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

In a first possible implementation manner, with reference to the second aspect, the sending synchronization information of a first forward error correction FEC codeword to a terminal device by using a management channel includes:

after the terminal device initiates an access or registration request to the central office device, sending the synchronization information of the first forward error correction FEC codeword to the terminal device by using the management channel.

In a second possible implementation manner, with reference to the first possible implementation manner of the second aspect, the method further includes: when the location that is of the FEC codeword input by a terminal decoder and is corresponding to the data at the agreed location of the agreed time-frequency resource block is different from the agreed location of the first FEC codeword, that is, the FEC codeword is unsynchronized, receiving a resynchronization request sent by the terminal device; and resending the synchronization information of the first FEC codeword to the terminal device by using the management channel, where the information about the agreed location of the first FEC codeword indicates a location that is of the first FEC codeword and is corresponding to data at an agreed location of an agreed time-frequency resource block.

In a third possible implementation manner, with reference to the second aspect or the first or the second possible implementation manner of the second aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the second aspect or any one of the first to the third possible implementation manners of the second aspect, the sending synchronization information of a first forward error correction FEC codeword to a terminal device by using a management channel includes:

sending a resource allocation indication message together with the synchronization information of the first FEC codeword by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

According to a third aspect, a terminal device is provided, including:

a terminal receiving unit, configured to receive synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block; and a codeword synchronization unit, configured to: reset a status parameter of a terminal decoder according to the synchronization information of the first FEC codeword, so that the terminal decoder starts decoding from the agreed location of the first FEC codeword, or reset a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

In a first possible implementation manner, with reference to the third aspect, the receiving synchronization information that is of a first forward error correction FEC codeword and is sent by the central office device by using a management channel includes:

after the terminal device initiates an access or registration request to the central office device, receiving the synchronization information that is of the first forward error correction FEC codeword and is sent by the central office device by using the management channel.

In a second possible implementation manner, with reference to the first possible implementation manner of the third aspect, when the location that is of the FEC codeword input by the terminal decoder and is corresponding to the data at the agreed location of the agreed time-frequency resource block is different from the agreed location of the first FEC codeword, that is, the FEC codeword is unsynchronized, the terminal device further includes:

a request unit, configured to send a resynchronization request message to the central office device; where the codeword synchronization unit is further configured to: receive the synchronization information that is of the first FEC codeword and is resent by the central office device by using the management channel, where the information about the agreed location of the first FEC codeword indicates a location that is of the first FEC codeword and is corresponding to data at an agreed location of an agreed time-frequency resource block; and reset status data of the terminal encoder, so that the location that is of the FEC codeword output by the terminal encoder and is corresponding to the data at the agreed location of the agreed time-frequency resource block is the same as the agreed location of the first FEC codeword, so as to complete codeword synchronization again.

In a third possible implementation manner, with reference to the third aspect or the first or the second possible implementation manner of the third aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the third aspect or any one of the first to the third possible implementation manners of the third aspect, the receiving synchronization information that is of a first forward error correction FEC codeword and is sent by the central office device by using a management channel includes:

receiving the synchronization information that is of the first FEC codeword and is periodically sent by the central office device by using the management channel, where a period for sending the synchronization information of the first FEC codeword is an integral multiple of a frame period.

In a fifth possible implementation manner, with reference to the third aspect or any one of the first to the fourth possible implementation manners of the third aspect, the receiving synchronization information that is of a first forward error correction FEC codeword and is sent by the central office device by using a management channel includes:

receiving a resource allocation indication message sent together with the synchronization information of the first FEC codeword by the central office device by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

According to a fourth aspect, a central office device is provided, including:

a sending unit, configured to send synchronization information of a first forward error correction FEC codeword to a terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

In a first possible implementation manner, with reference to the fourth aspect, the sending synchronization information of a first forward error correction FEC codeword to a terminal device by using a management channel includes:

after the terminal device initiates an access or registration request to the central office device, sending the synchronization information of the first forward error correction FEC codeword to the terminal device by using the management channel.

In a second possible implementation manner, with reference to the first possible implementation manner of the fourth aspect, when the location that is of the FEC codeword input by a terminal decoder and is corresponding to the data at the agreed location of the agreed time-frequency resource block is different from the agreed location of the first FEC codeword, that is, the FEC codeword is unsynchronized, the central office device further includes:

a central office receiving unit, configured to receive a resynchronization request sent by the terminal device; where the sending unit is further configured to resend the synchronization information of the first FEC codeword to the terminal device by using the management channel, where the information about the agreed location of the first FEC codeword indicates a location that is of the first FEC codeword and is corresponding to data at an agreed location of an agreed time-frequency resource block.

In a third possible implementation manner, with reference to the fourth aspect or the first or the second possible implementation manner of the fourth aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the fourth aspect or any one of the first to the third possible implementation manners of the fourth aspect, the sending synchronization information of a first forward error correction FEC codeword to a terminal device by using a management channel includes:

sending a resource allocation indication message together with the synchronization information of the first FEC codeword by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

According to a fifth aspect, a terminal device is provided, including a first bus, and a first interface, a first memory, and a first processor that are connected to the first bus, where the first memory is configured to store a first instruction, and the first processor is configured to execute the first instruction to:

receive, by using the first interface, synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block; and reset a status parameter of a terminal decoder according to the synchronization information of the first FEC codeword, so that the terminal decoder starts decoding from the agreed location of the first FEC codeword, or reset a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

In a first possible implementation manner, with reference to the fifth aspect, the first processor is configured to execute the first instruction to:

after the terminal device initiates an access or registration request to the central office device, receive, by using the first interface, the synchronization information that is of the first forward error correction FEC codeword and is sent by the central office device by using the management channel.

In a second possible implementation manner, with reference to the first possible implementation manner of the fifth aspect, when the location that is of the FEC codeword input by the terminal decoder and is corresponding to the data at the agreed location of the agreed time-frequency resource block is different from the agreed location of the first FEC codeword, that is, the FEC codeword is unsynchronized, the first processor is further configured to execute the first instruction to:

send a resynchronization request message to the central office device by using the first interface;

receive the synchronization information that is of the first FEC codeword and is resent by the central office device by using the management channel, where the information about the agreed location of the first FEC codeword indicates a location that is of the first FEC codeword and is corresponding to data at an agreed location of an agreed time-frequency resource block; and reset status data of the terminal encoder, so that the location that is of the FEC codeword output by the terminal encoder and is corresponding to the data at the agreed location of the agreed time-frequency resource block is the same as the agreed location of the first FEC codeword, so as to complete codeword synchronization again.

In a third possible implementation manner, with reference to the fifth aspect or the first or the second possible implementation manner of the fifth aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the fifth aspect or any one of the first to the third possible implementation manners of the fifth aspect, the first processor is further configured to execute the first instruction to:

receive, by using the first interface, the synchronization information that is of the first. FEC codeword and is periodically sent by the central office device by using the management channel, where a period for sending the synchronization information of the first FEC codeword is an integral multiple of a frame period.

In a fifth possible implementation manner, with reference to the fifth aspect or any one of the first to the fourth possible implementation manners of the fifth aspect, the first processor is further configured to execute the first instruction to:

receive, by using the first interface, a resource allocation indication message sent together with the synchronization information of the first FEC codeword by the central office device by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

According to a sixth aspect, a central office device is provided, including a second bus, and a second interface, a second memory, and a second processor that are connected to the second bus, where the second memory is configured to store a second instruction, and the second processor is configured to execute the second instruction to:

send, by using the second interface, synchronization information of a first forward error correction FEC codeword to a terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

In a first possible implementation manner, with reference to the sixth aspect, the second processor is further configured to execute the second instruction to:

after the terminal device initiates an access or registration request to the central office device, send the synchronization information of the first forward error correction FEC codeword to the terminal device by using the management channel by using the second interface.

In a second possible implementation manner, with reference to the first possible implementation manner of the sixth aspect, when the location that is of the FEC codeword input by a terminal decoder and is corresponding to the data at the agreed location of the agreed time-frequency resource block is different from the agreed location of the first FEC codeword, the second processor is further configured to execute the second instruction to:

receive, by using the second interface, a resynchronization request sent by the terminal device; and resend the synchronization information of the first FEC codeword to the terminal device by using the management channel, where the information about the agreed location of the first FEC codeword indicates a location that is of the first FEC codeword and is corresponding to data at an agreed location of an agreed time-frequency resource block.

In a third possible implementation manner, with reference to the sixth aspect or the first or the second possible implementation manner of the sixth aspect, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

In a fourth possible implementation manner, with reference to the sixth aspect or any one of the first to the third possible implementation manners of the sixth aspect, the second processor is further configured to execute the second instruction to:

send a resource allocation indication message together with the synchronization information of the first FEC codeword by using the management channel by using the second interface, where the resource allocation indication message is used to indicate an allocation status parameter of a time-frequency resource block and includes a resource allocation message, and the agreed time-frequency resource block is the time-frequency resource block indicated in the resource allocation indication message.

According to a seventh aspect, a forward error correction codeword synchronization system is provided, where the system includes:

the terminal device according to the fifth aspect; and the central office device according to the sixth aspect.

The embodiments of the present invention provide a forward error correction codeword synchronization method, device, and system. A central office device sends synchronization information of an FEC codeword to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
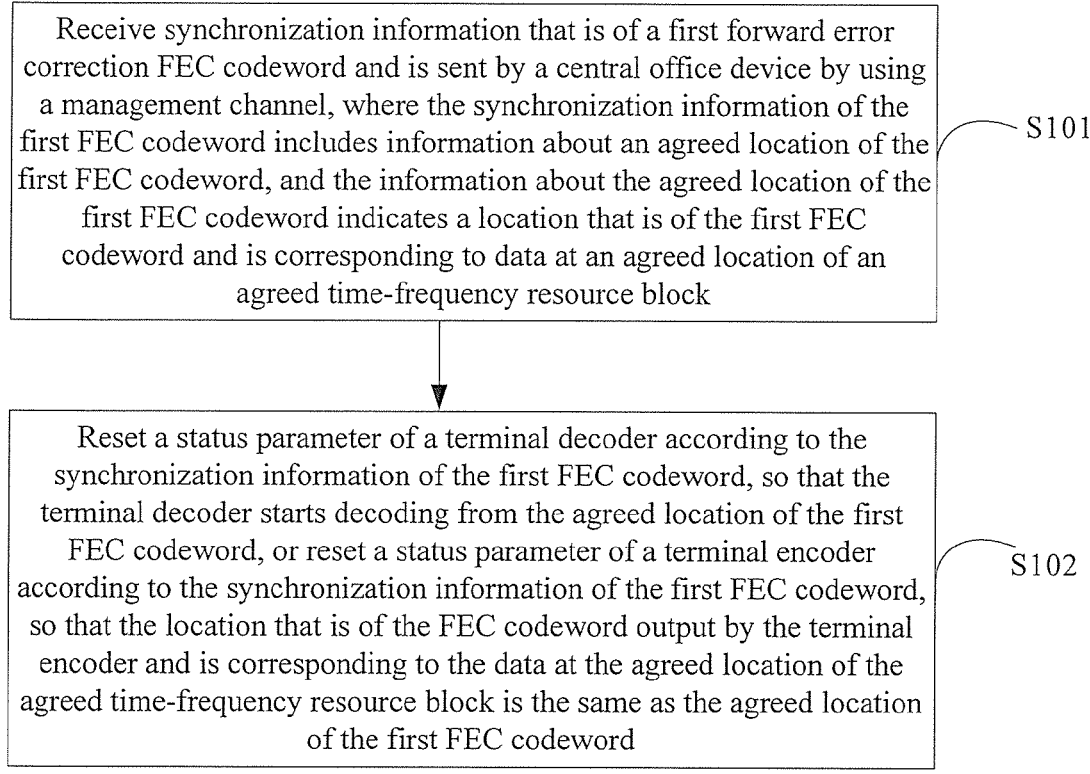
FIG. 1 is a schematic flowchart of a forward error correction codeword synchronization method according to an embodiment of the present invention.

An embodiment of the present invention provides a forward error correction codeword synchronization method. As shown in FIG. 1, based on a terminal side, the method includes:

S101. Receive synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

S102. Reset a status parameter of a terminal decoder according to the synchronization information of the first FEC codeword, so that the terminal decoder starts decoding from the agreed location of the first FEC codeword, or reset a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

Figure 2:
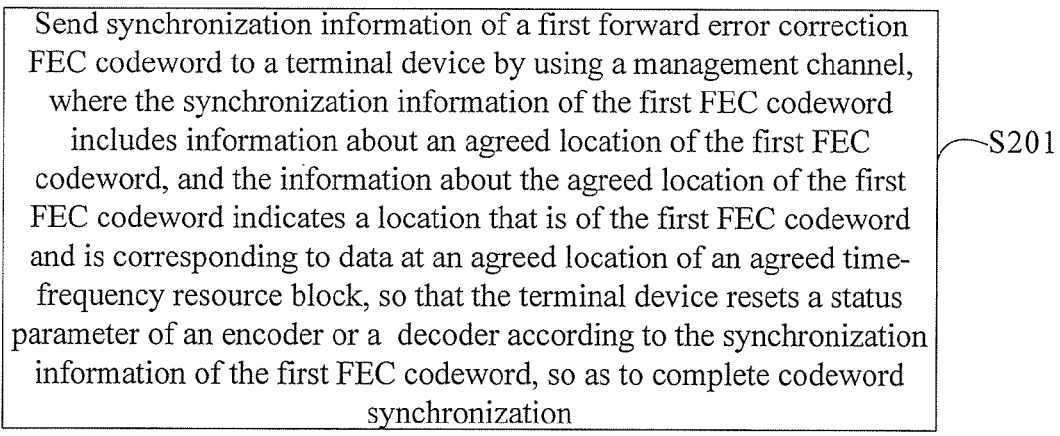
FIG. 2 is a schematic flowchart of another forward error correction codeword synchronization method according to an embodiment of the present invention.

Correspondingly, an embodiment of the present invention further provides another forward error correction codeword synchronization method. As shown in FIG. 2, based on a central office side, the method includes:

S201. Send synchronization information of a first forward error correction FEC codeword to a terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block, so that the terminal device resets a status parameter of an encoder or a decoder according to the synchronization information of the first FEC codeword, so as to complete codeword synchronization.

This embodiment of the present invention provides a forward error correction codeword synchronization method. A central office device sends synchronization information of an FEC codeword to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 3:
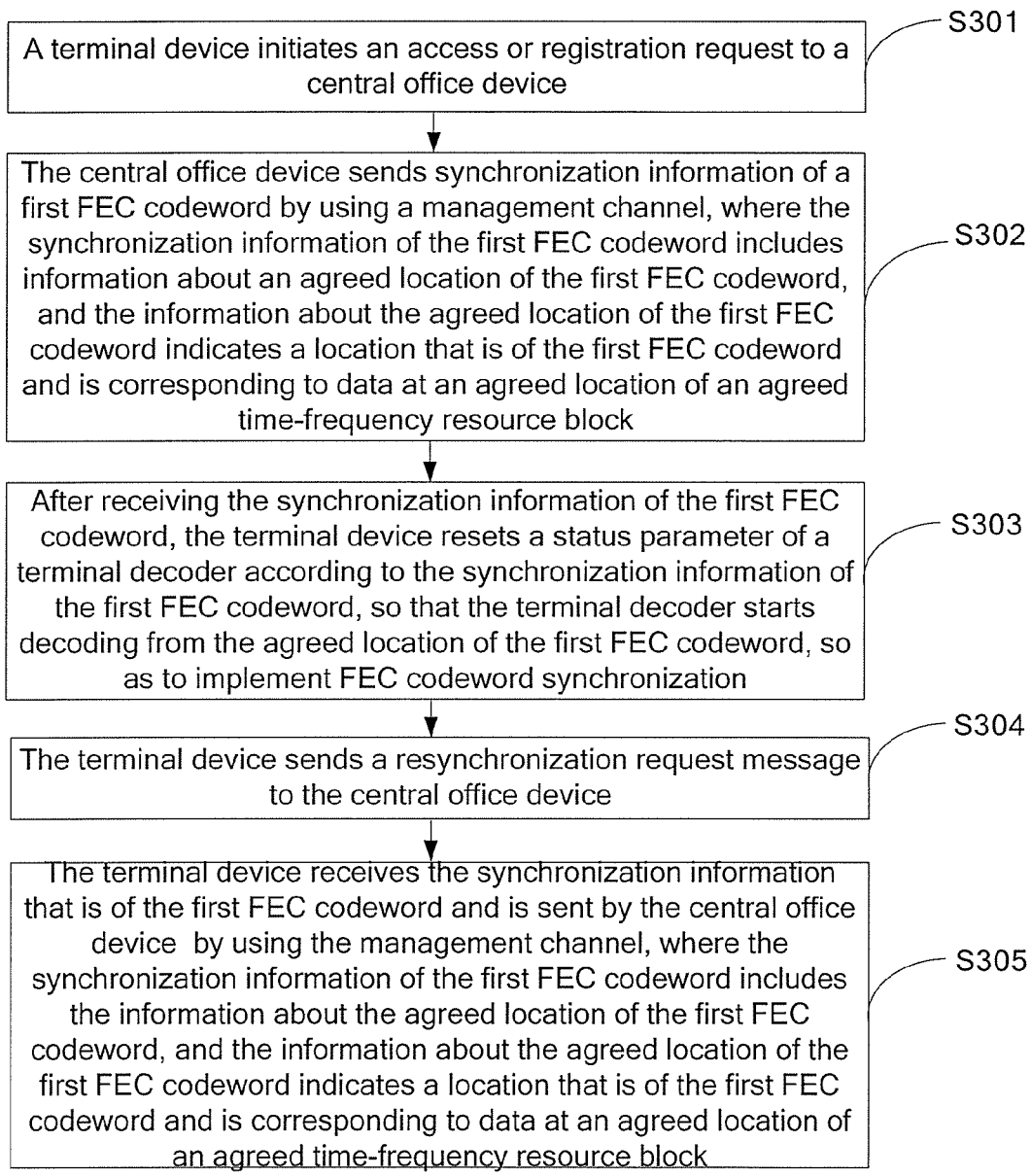
FIG. 3 is a schematic flowchart of still another forward error correction codeword synchronization method according to an embodiment of the present invention.

To make a person skilled in the art better understand technical solutions provided in embodiments of the present invention, the following provides, by using a specific embodiment, a detailed description of a forward error correction codeword synchronization method provided in an embodiment of the present invention. As shown in FIG. 3, the method includes:

S301. A terminal device initiates an access or registration request to a central office device.

S302. The central office device sends synchronization information of a first FEC codeword by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

Figure 4:
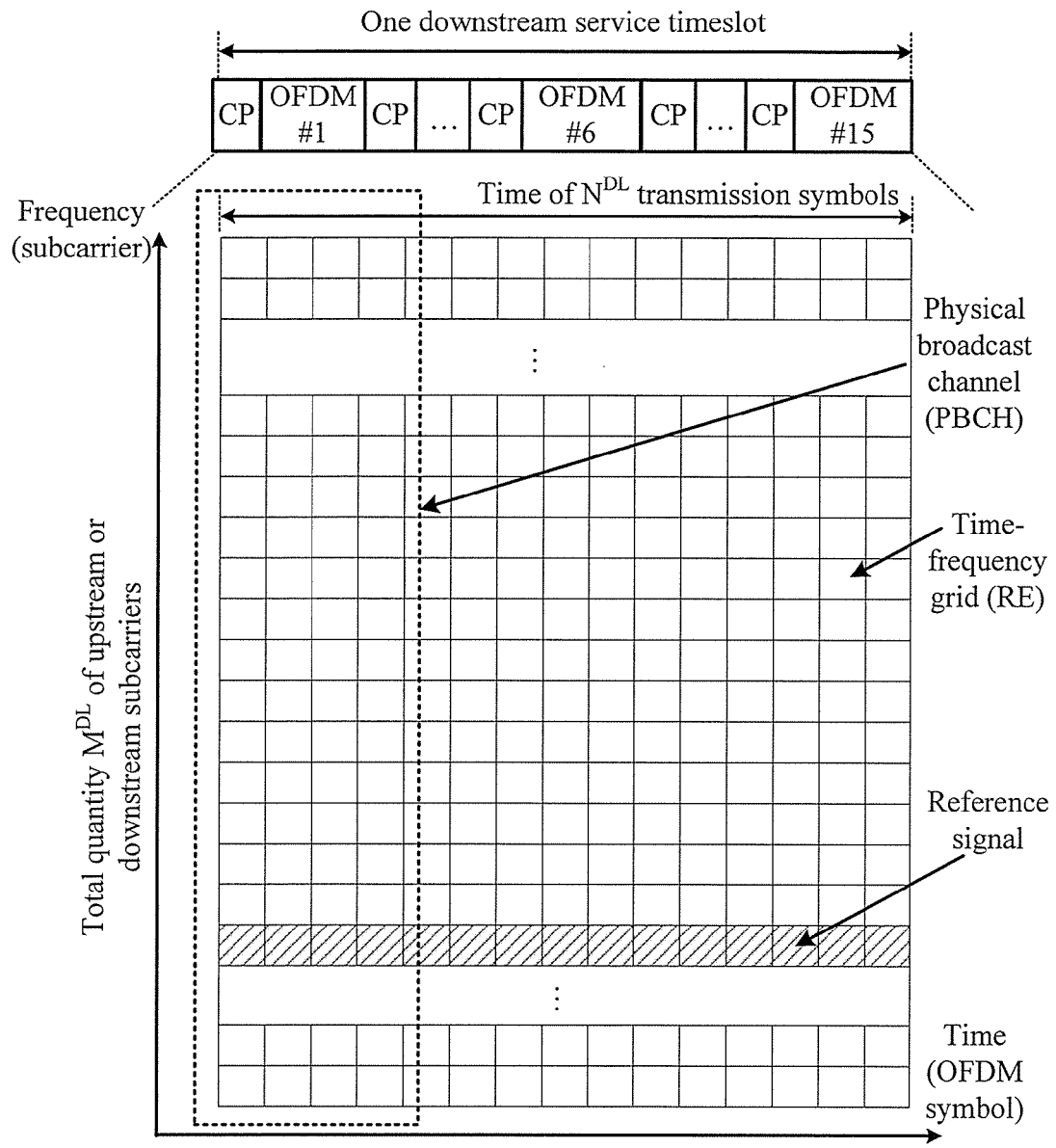
FIG. 4 is a schematic diagram of a management channel according to an embodiment of the present invention.
Figure 5:
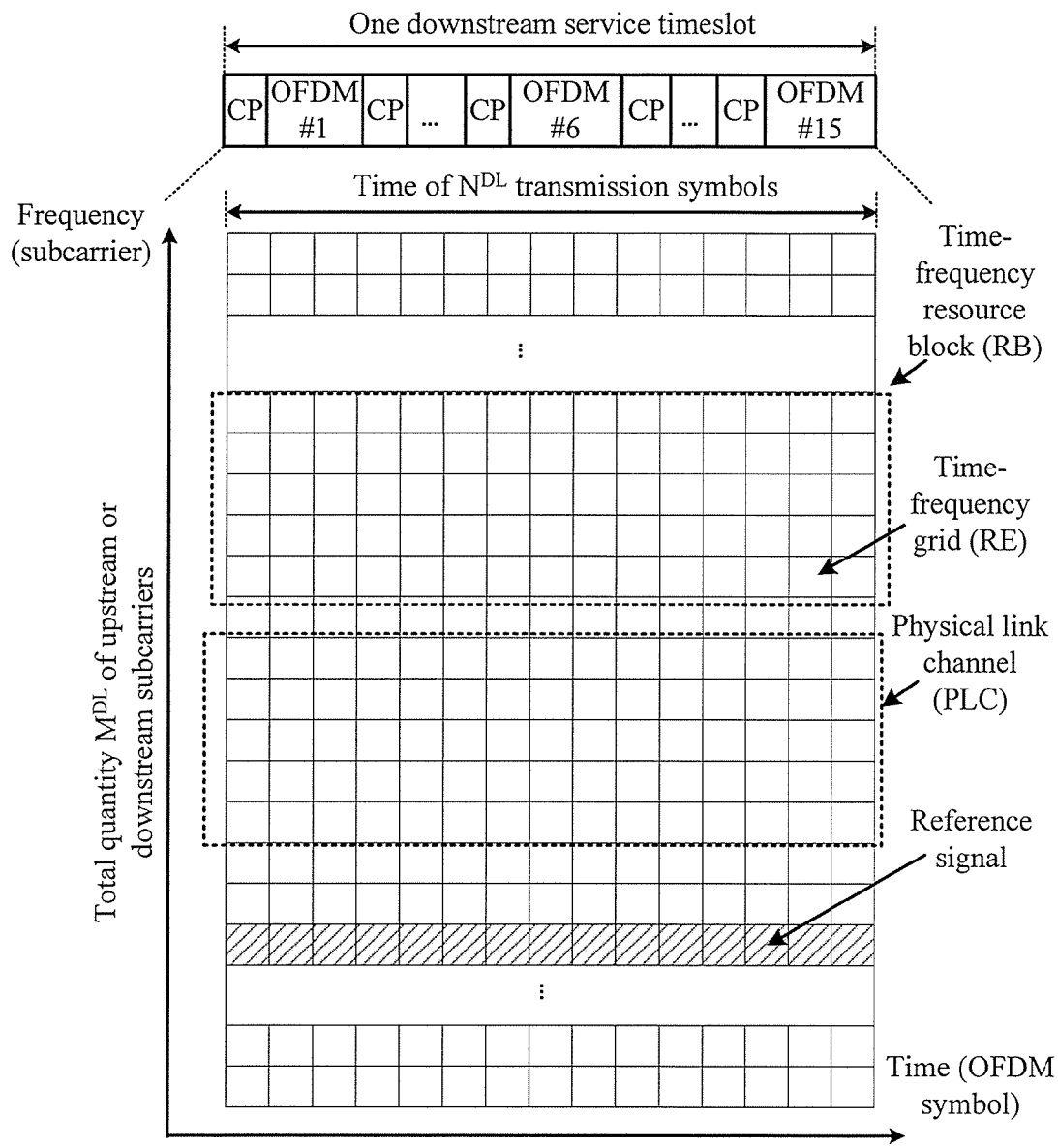
FIG. 5 is a schematic diagram of another management channel according to an embodiment of the present invention.

Specifically, this step may be implemented by using the following method:

The central office device sends synchronization information of an FEC codeword on a physical broadcast channel (PBCH) (as shown in FIG. 4, where a CP is a cyclic prefix, OFDM is Frequency Division Multiplexing, a Resource Block (RB) is a time-frequency resource block or a resource block, and a Resource Element (RE) is a time-frequency grid) or a PLC (Physical Link Channel) physical link channel (as shown in FIG. 5), where the information includes information about an agreed location of an FEC codeword, and the information about the agreed location of the FEC codeword indicates a location that is of an FEC codeword and is corresponding to data at an agreed location of an agreed time-frequency resource block.

Figure 6:
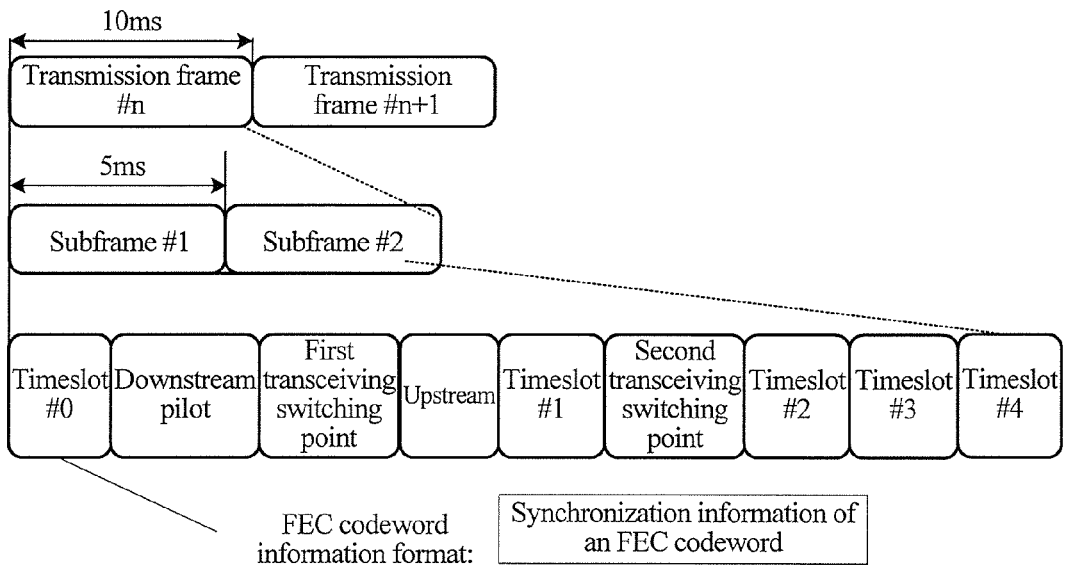
FIG. 6 is a schematic diagram of a frame structure in a point-to-multipoint system according to an embodiment of the present invention.

Exemplarily, in a point-to-multipoint system, in a case of a downstream broadcast or unicast or multicast mode, when a new terminal device initiates a random access or registration request to the central office device, after receiving the request, the central office device sends synchronization information of a first FEC codeword to the terminal device on a management channel (such as a PBCH channel in a timeslot #0 shown in FIG. 6), where the synchronization information of the codeword includes information about an agreed location of an FEC codeword, and the information about the agreed location of the FEC codeword indicates a location that is of an FEC codeword and is corresponding to data at an agreed location of an agreed time-frequency resource block. After receiving the synchronization information that is of the first FEC codeword and is sent by the central office device, the terminal device adjusts a status parameter of a decoder, so that the terminal decoder starts decoding from the agreed location of the first FEC codeword. Therefore, for a subsequent data stream, FEC codeword synchronization is automatically implemented sequentially according to an agreed length of the first FEC codeword.

In addition, in the point-to-multipoint system, in the case of the downstream broadcast or unicast or multicast mode, after the random access or registration request is completed, the central office device sends synchronization information of a second FEC codeword together with a media access plan (MAP) message, as a resource allocation indication message, to the terminal device on a management channel (such as a PLC channel in a timeslot #1 shown in FIG. 7), where the synchronization information of the second FEC codeword includes a location that is of an FEC codeword and is corresponding to the first piece of data of a time-frequency resource block indicated in the resource allocation indication message or information about a start location that is of the second FEC codeword and is corresponding to a time-frequency resource block indicated in the resource allocation indication message. After receiving the MAP message and the synchronization information of the second FEC codeword that are sent by the central office device, the terminal device adjusts the status parameter of the decoder, so that a boundary location of an FEC codeword input by the terminal decoder is the same as a boundary location of an FEC codeword output by a central office encoder. Therefore, for a subsequent data stream, FEC codeword synchronization is automatically implemented sequentially according to an agreed length of the second FEC codeword.

S303. After receiving the synchronization information of the first FEC codeword, the terminal device resets a status parameter of a terminal decoder according to the synchronization information of the first FEC codeword, so that the terminal decoder starts decoding from the agreed location of the first FEC codeword, so as to implement FEC codeword synchronization.

Optionally, in data communication, a MAP message (resource allocation indication message) may be damaged, and as a result an FEC codeword unsynchronized. In this case, the method further includes the following steps:

S304. The terminal device sends a resynchronization request message to the central office device.

S305. The terminal device receives the synchronization information that is of the first FEC codeword and is sent by the central office device by using the management channel, where the synchronization information of the first FEC codeword includes the information about the agreed location of the first FEC codeword, and the information about the agreed location of the first FEC codeword indicates a location that is of the first FEC codeword and is corresponding to data at an agreed location of an agreed time-frequency resource block.

Figure 7:
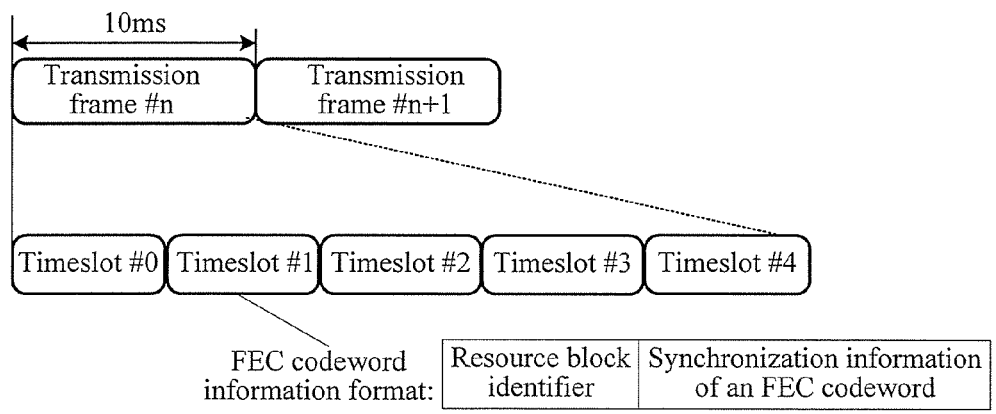
FIG. 7 is a schematic diagram of another frame structure in a point-to-multipoint system according to an embodiment of the present invention.

Exemplarily, as shown in FIG. 7, in the point-to-multipoint system, in an upstream direction, after receiving an FEC codeword resynchronization request sent by the terminal device, the central office device sends synchronization information of an FEC codeword on the PLC channel in the timeslot #1, where the synchronization information of the FEC codeword may be used to indicate information about an agreed location of an FEC codeword, and the information about the agreed location of the FEC codeword indicates a location that is of an FEC codeword and is corresponding to data at an agreed location of an agreed time-frequency resource block. After receiving the synchronization information that is of the FEC codeword and is sent by the central office device, the terminal device immediately resets an encoding and sending status parameter of a terminal encoder according to the information, so that the terminal encoder places bits of a first piece of data of the agreed resource block at a location that is of an FEC codeword and is agreed by the terminal device and the central office device, and a boundary location of a codeword input by a central office decoder is the same as a boundary location of an FEC codeword output by the terminal encoder; therefore, for a subsequent data stream, FEC codeword synchronization is automatically implemented sequentially according to a size of an FEC codeword.

In addition, the central office device may further periodically send the synchronization information of the FEC codeword on the management channel.

Figure 8:
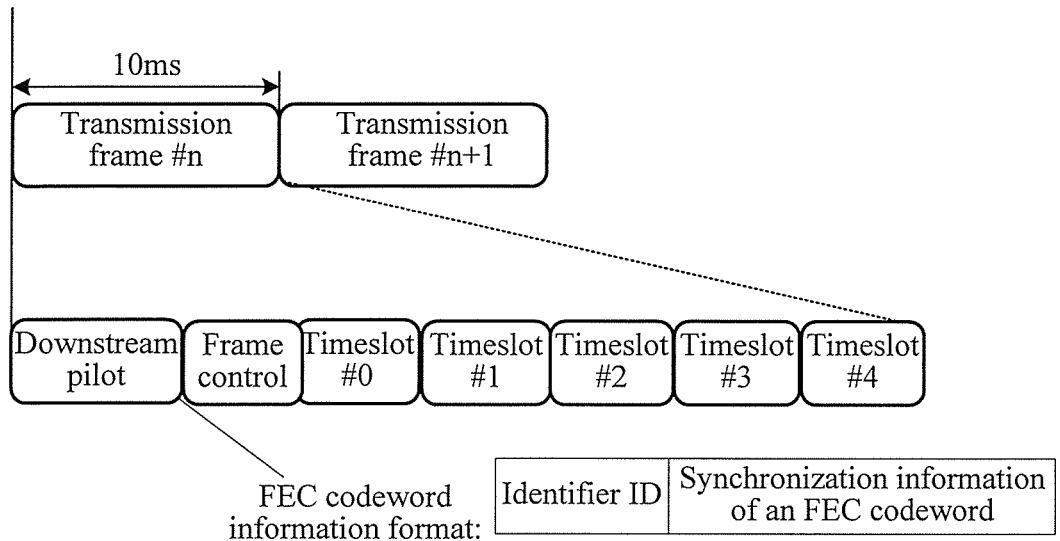
FIG. 8 is a schematic diagram of still another frame structure in a point-to-multipoint system according to an embodiment of the present invention.

Exemplarily, as shown in FIG. 8, in the point-to-multipoint system, the central office device periodically sends the synchronization information of the FEC codeword on the management channel. In this case, the management channel may be a PBCH channel in an FC (Frame Control) timeslot, and a period may be an integral multiple of a frame period. After receiving the synchronization information of the FEC codeword in the FC timeslot, the terminal device resets a status parameter of the encoder or the decoder, so as to implement FEC codeword synchronization. A synchronization method is the same as the foregoing method, and details are not described herein again.

It should be noted that an FEC codeword synchronization information format includes an identifier ID, which is used to distinguish different users or user groups or different types of services.

In addition, codeword synchronization also needs to be performed after the terminal device completes a random access or registration procedure, in addition to initiation of a random access or registration request by the terminal device. A synchronization method is completely the same as the foregoing method.

This embodiment of the present invention provides a forward error correction codeword synchronization method. A central office device sends synchronization information of an FEC codeword to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 9:
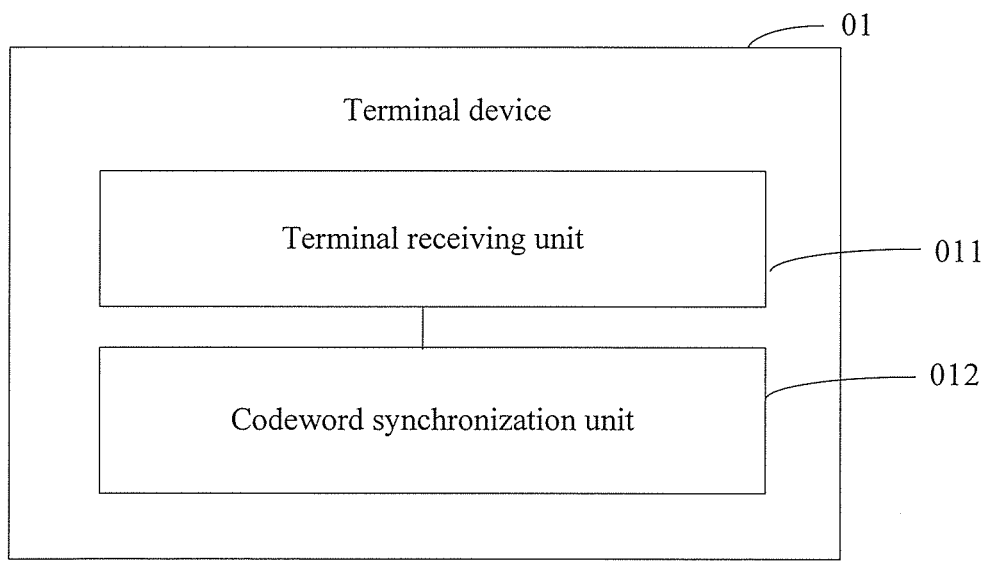
FIG. 9 is a schematic structural diagram of a terminal device according to an embodiment of the present invention.

The present invention provides a terminal device 01. As shown in FIG. 9, the terminal device 01 includes:

a terminal receiving unit 011, configured to receive synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block; and a codeword synchronization unit 012, configured to: reset a status parameter of a terminal decoder according to the synchronization information of the first FEC codeword, so that the terminal decoder starts decoding from the agreed location of the first FEC codeword, or reset a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

Further, the receiving synchronization information that is of a first forward error correction FEC codeword and is sent by a central office device by using a management channel includes:

after the terminal device initiates an access or registration request to the central office device, receiving the synchronization information that is of the first forward error correction FEC codeword and is sent by the central office device by using the management channel.

Figure 10:
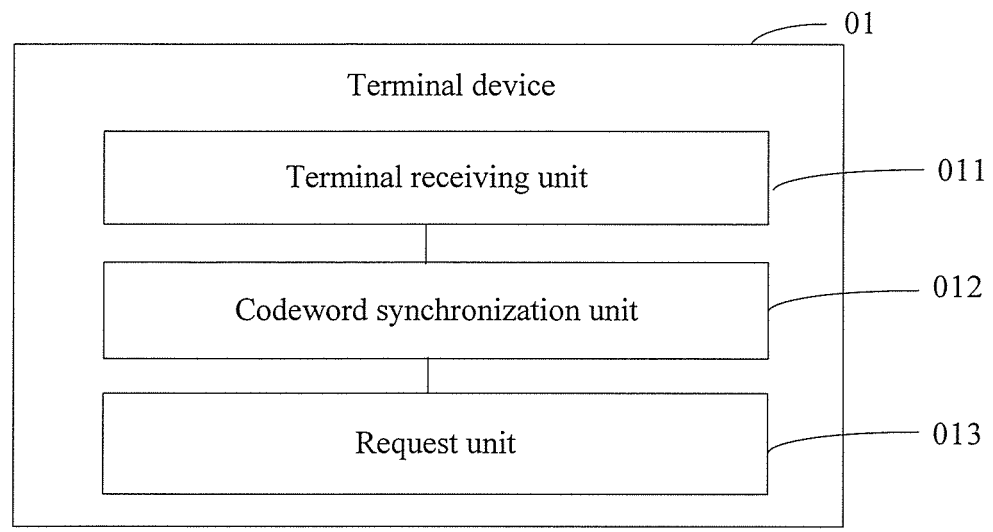
FIG. 10 is a schematic structural diagram of another terminal device according to an embodiment of the present invention.

Still further, as shown in FIG. 10, when the location that is of the FEC codeword input by the terminal decoder and is corresponding to the data at the agreed location of the agreed time-frequency resource block is different from the agreed location of the first FEC codeword, that is, the FEC codeword is unsynchronized, the terminal device 01 further includes:

a request unit 013, configured to send a resynchronization request message to the central office device.

The codeword synchronization unit 012 is further configured to: receive the synchronization information that is of the first FEC codeword and is resent by the central office device by using the management channel, where the information about the agreed location of the first FEC codeword indicates a location that is of the first FEC codeword and is corresponding to data at an agreed location of an agreed time-frequency resource block; and reset status data of the terminal encoder, so that the location that is of the FEC codeword output by the terminal encoder and is corresponding to the data at the agreed location of the agreed time-frequency resource block is the same as the agreed location of the first FEC codeword, so as to complete codeword synchronization again.

Still further, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

Still further, the receiving synchronization information that is of a first forward error correction FEC codeword and is sent by a central office device by using a management channel includes:

receiving the synchronization information that is of the first FEC codeword and is periodically sent by the central office device by using the management channel, where a period for sending the synchronization information of the first FEC codeword is an integral multiple of a frame period.

Still further, the receiving synchronization information that is of a first forward error correction FEC codeword and is sent by a central office device by using a management channel includes:

receiving a resource allocation indication message sent together with the synchronization information of the first FEC codeword by the central office device by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

This embodiment of the present invention provides a terminal device. Synchronization information that is of an FEC codeword and is sent by a central office device is received, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 11:
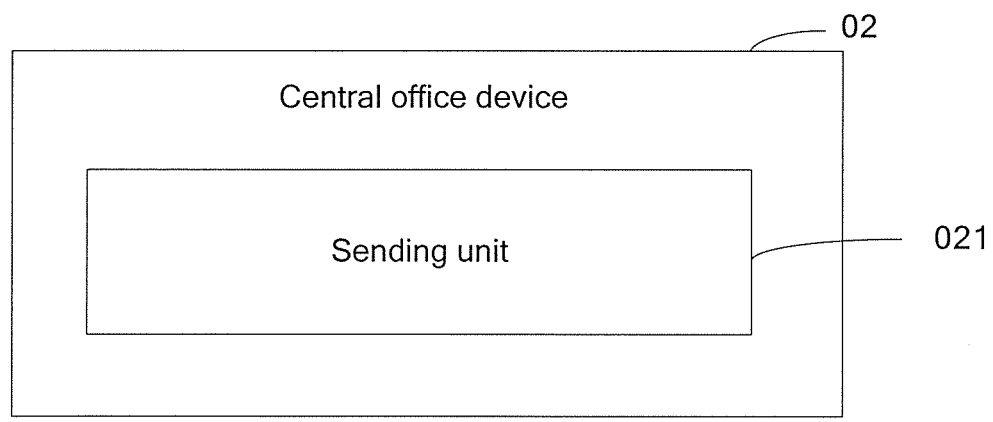
FIG. 11 is a schematic structural diagram of a central office device according to an embodiment of the present invention.

Another embodiment of the present invention provides a central office device 02. As shown in FIG. 11, the device includes:

a sending unit 021, configured to send synchronization information of a first forward error correction FEC codeword to a terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

Still further, the sending synchronization information of a first forward error correction FEC codeword to a terminal device by using a management channel includes:

after the terminal device initiates an access or registration request to the central office device, sending the synchronization information of the first forward error correction FEC codeword to the terminal device by using the management channel.

Figure 12:
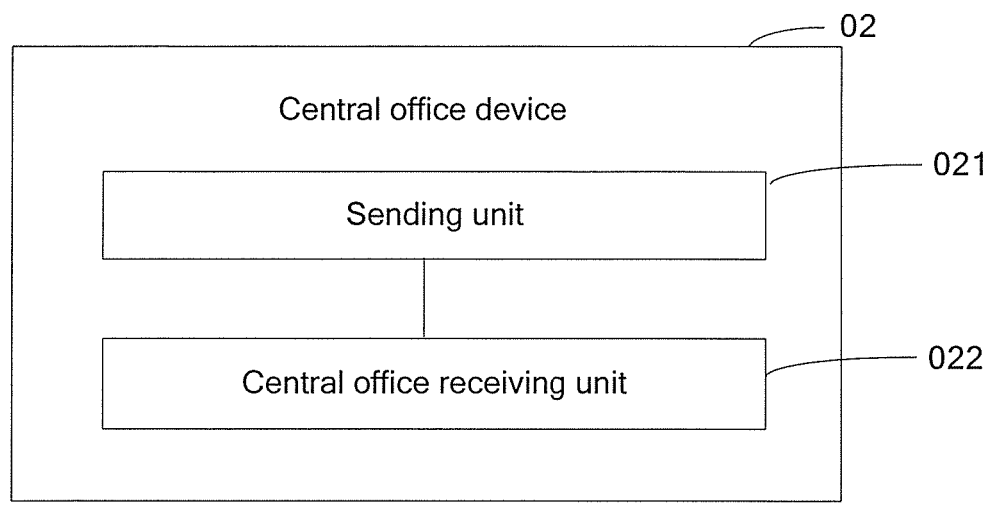
FIG. 12 is a schematic structural diagram of another central office device according to an embodiment of the present invention.

Still further, as shown in FIG. 12, when the location that is of the FEC codeword input by a terminal decoder and is corresponding to the data at the agreed location of the agreed time-frequency resource block is different from the agreed location of the first FEC codeword, the central office device 02 further includes:

a central office receiving unit 022, configured to receive a resynchronization request sent by the terminal device.

The sending unit 021 is specifically configured to resend the synchronization information of the first FEC codeword to the terminal device by using the management channel, where the information about the agreed location of the first FEC codeword indicates a location that is of the first FEC codeword and is corresponding to data at an agreed location of an agreed time-frequency resource block.

Still further, that the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

Still further, the sending synchronization information of a first forward error correction FEC codeword to a terminal device by using a management channel includes:

sending a resource allocation indication message together with the synchronization information of the first FEC codeword by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

This embodiment of the present invention provides a central office device. Synchronization information of an FEC codeword is sent to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block, so that the terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 13:
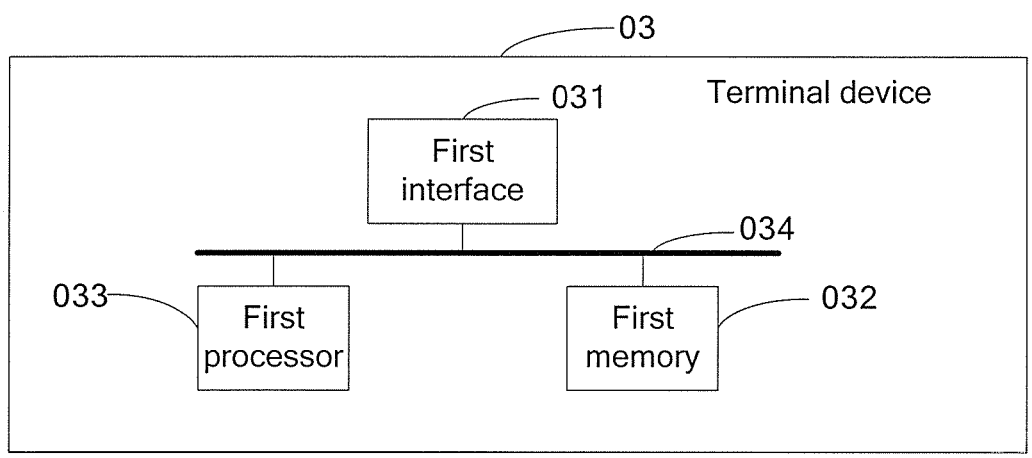
FIG. 13 is a schematic structural diagram of still another terminal device according to an embodiment of the present invention.

An embodiment of the present invention provides another terminal device 03. As shown in FIG. 13, the device 03 includes a first bus 034, and a first interface 031, a first memory 032, and a first processor 033 that are connected to the first bus 034, where the first memory 032 is configured to store a first instruction, and the first processor 033 is configured to execute the first instruction to:

receive, by using the first interface 031, synchronization information that is of a first forward error correction FEC codeword and is sent by a central office device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block; and reset a status parameter of a terminal decoder according to the synchronization information of the first FEC codeword, so that the terminal decoder starts decoding from the agreed location of the first FEC codeword, or reset a status parameter of a terminal encoder according to the synchronization information of the first FEC codeword, so that the location that is of the FEC codeword output by the terminal encoder and is corresponding to the data at the agreed location of the agreed time-frequency resource block is the same as the agreed location of the first FEC codeword.

The receiving synchronization information that is of a first forward error correction FEC codeword and is sent by a central office device by using a management channel includes:

after the terminal device initiates an access or registration request to the central office device, receiving the synchronization information that is of the first forward error correction FEC codeword and is sent by the central office device by using the management channel.

Optionally, when the location that is of the FEC codeword input by the terminal decoder and is corresponding to the data at the agreed location of the agreed time-frequency resource block is different from the agreed location of the first FEC codeword, that is, the FEC codeword is unsynchronized, the first processor 033 may be further configured to execute the first instruction to:

send a resynchronization request message to the central office device by using the first interface 031;

receive the synchronization information that is of the first FEC codeword and is resent by the central office device by using the management channel, where the information about the agreed location of the first FEC codeword indicates a location that is of the first FEC codeword and is corresponding to data at an agreed location of an agreed time-frequency resource block; and reset status data of the terminal encoder, so that the location that is of the FEC codeword output by the terminal encoder and is corresponding to the data at the agreed location of the agreed time-frequency resource block is the same as the agreed location of the first FEC codeword, so as to complete codeword synchronization again.

That the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

Preferably, the first processor 033 is further configured to execute the first instruction to:

receive, by using the first interface 031, the synchronization information that is of the first FEC codeword and is periodically sent by the central office device by using the management channel, where a period for sending the synchronization information of the first FEC codeword is an integral multiple of a frame period.

Optionally, the first processor 033 may be further configured to execute the first instruction to:

receive, by using the first interface 031, a resource allocation indication message sent together with the synchronization information of the first FEC codeword by the central office device by using the management channel, where the resource allocation indication message is used to indicate an allocation status parameter of a time-frequency resource block and includes a resource allocation message, and the agreed time-frequency resource block is the time-frequency resource block indicated in the resource allocation indication message.

This embodiment of the present invention provides another terminal device. Synchronization information that is of an FEC codeword and is sent by a central office device is received, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 14:
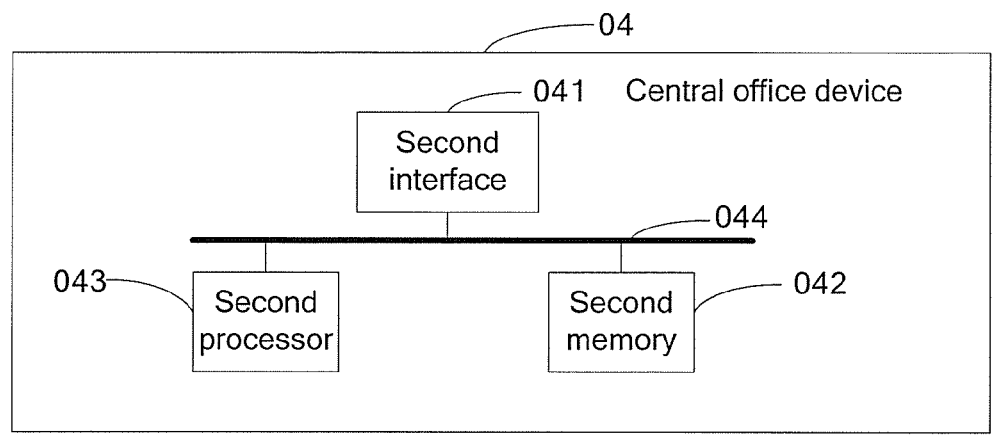
FIG. 14 is a schematic structural diagram of still another central office device according to an embodiment of the present invention.

An embodiment of the present invention provides another central office device 04. As shown in FIG. 14, the device 04 includes a second bus 044, and a second interface 041, a second memory 042, and a second processor 043 that are connected to the second bus 044, where the second memory 042 is configured to store a second instruction, and the second processor 043 is configured to execute the second instruction to:

send, by using the second interface 041, synchronization information of a first forward error correction FEC codeword to a terminal device by using a management channel, where the synchronization information of the first FEC codeword includes information about an agreed location of the first FEC codeword, and the information about the agreed location of the first FEC codeword indicates a location that is of the first FEC codeword and is corresponding to data at an agreed location of an agreed time-frequency resource block.

Optionally, when the FEC codeword is unsynchronized, the second processor 043 may be further configured to execute the second instruction to:

after the terminal device initiates an access or registration request to the central office device, send the synchronization information of the first forward error correction FEC codeword to the terminal device by using the management channel by using the second interface 041.

Optionally, when the location that is of the FEC codeword input by a terminal decoder and is corresponding to the data at the agreed location of the agreed time-frequency resource block is different from the agreed location of the first FEC codeword, the second processor 043 may be further configured to execute the second instruction to:

receive, by using the second interface 041, a resynchronization request sent by the terminal device; and resend the synchronization information of the first FEC codeword to the terminal device by using the management channel, where the information about the agreed location of the first FEC codeword indicates a location that is of the first FEC codeword and is corresponding to data at an agreed location of an agreed time-frequency resource block.

That the information about the agreed location of the first FEC codeword indicates a location that is of the first FEC codeword and is corresponding to data at an agreed location of an agreed time-frequency resource block includes:

the information about the agreed location of the first FEC codeword indicates a location that is of the first FEC codeword and is corresponding to the first piece of data of the agreed time-frequency resource block or indicates a boundary location of the first FEC codeword that is of the agreed time-frequency resource block and is corresponding to the data at the agreed location of the agreed time-frequency resource block, where the boundary location includes a start or end location.

Optionally, the second processor 043 may be further configured to execute the second instruction to:

send a resource allocation indication message together with the synchronization information of the first FEC codeword by using the management channel by using the second interface 041, where the resource allocation indication message is used to indicate an allocation status parameter of a time-frequency resource block and includes a resource allocation message, and the agreed time-frequency resource block is the time-frequency resource block indicated in the resource allocation indication message.

This embodiment of the present invention provides a central office device. Synchronization information of an FEC codeword is sent to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block, so that the terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

Figure 15:
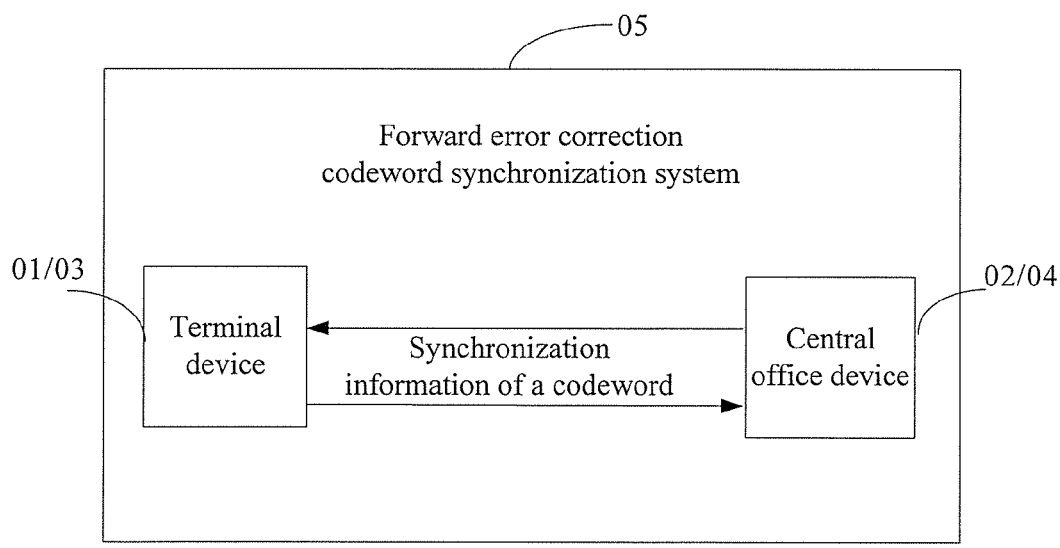
FIG. 15 is a schematic structural diagram of a forward error correction codeword synchronization system according to an embodiment of the present invention.

An embodiment of the present invention provides a forward error correction codeword synchronization system 05. As shown in FIG. 15, the system 05 includes:

the terminal device 01 or 03 according to the embodiment of the present invention; and the central office device 02 or 04 according to the embodiment of the present invention.

This embodiment of the present invention provides a forward error correction codeword synchronization system. In the system, a central office device sends synchronization information of an FEC codeword to a terminal device by using a management channel, where the information includes information about an agreed location of an FEC codeword, and the information about the agreed location of the FEC codeword indicates a location that is of an FEC codeword and is corresponding to data at an agreed location of an agreed time-frequency resource block. The terminal device receives the synchronization information that is of the FEC codeword and is sent by the central office device, and adjusts a status parameter of an encoder or a decoder according to the information, so as to complete codeword synchronization, so that system overheads can be reduced in a case in which FEC codeword synchronization is implemented.

In the several embodiments provided in this application, it should be understood that the disclosed method and apparatus may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present invention. The foregoing storage medium includes: any medium that can store program code, such as a USB flash drive, a removable hard disk, a read-only memory (Read-Only Memory, ROM), a random access memory (Random Access Memory, RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A forward error correction codeword synchronization method, the method comprising:
   after a terminal device initiates an access or registration request to a central office device, receiving synchronization information of a first forward error correction (FEC) codeword sent by the central office device by using a management channel, wherein the synchronization information comprises information about a location, agreed to by the terminal device and the central office device, of the first FEC codeword and corresponding to data at a location, agreed to by the terminal device and the central office device, of a time-frequency resource block agreed to by the terminal device and the central office device;
   resetting a status parameter of a terminal decoder according to the synchronization information of the first FEC codeword, wherein the terminal decoder starts decoding from the location of the first FEC codeword, or resetting a status parameter of a terminal encoder according to the synchronization information of the first FEC codeword, wherein the location of a FEC codeword output by the terminal encoder and corresponding to the data at the location of the time-frequency resource block is the same as the location of the first FEC codeword;
   when the location of the FEC codeword input by the terminal decoder and corresponding to the data at the location of the time-frequency resource block is different from the location of the first FEC codeword:
      sending a resynchronization request message to the central office device,
      receiving the synchronization information of the first FEC codeword and resent by the central office device by using the management channel, and
      resetting status data of the terminal encoder, wherein the location of the FEC codeword output by the terminal encoder and corresponding to the data at the location of the time-frequency resource block is the same as the location of the first FEC codeword.

2. The method according to claim 1, wherein the information about the agreed location of the first FEC codeword corresponds to a first piece of data of the time-frequency resource block or indicates a boundary location of the first FEC codeword that is of the time-frequency resource block and corresponds to the data at the location of the time-frequency resource block, wherein the boundary location comprises a start or end location.

3. The method according to claim 1, wherein receiving the synchronization information of the first forward error correction (FEC) codeword sent by the central office device by using the management channel comprises:
   receiving the synchronization information of the first FEC codeword periodically sent by the central office device by using the management channel, wherein a period for sending the synchronization information of the first FEC codeword is an integral multiple of a frame period.

4. The method according to claim 1, wherein receiving the synchronization information of the first forward error correction (FEC) codeword sent by the central office device by using the management channel comprises:
   receiving a resource allocation indication message sent together with the synchronization information of the first FEC codeword by the central office device by using the management channel, wherein the resource allocation indication message is used to indicate an allocation status parameter of a time-frequency resource block and comprises a resource allocation message, and the time-frequency resource block is the time-frequency resource block indicated in the resource allocation indication message.

5. A forward error correction (FEC) codeword synchronization method, the method comprising:
   after a terminal device initiates an access or registration request to a central office device, sending synchronization information of a first FEC codeword to the terminal device using a management channel, wherein the synchronization information comprises information about a location, agreed to by the terminal device and the central office device, of the first FEC codeword and corresponding to data at a location, agreed to by the terminal device and the central office device, of a time-frequency resource block agreed to by the terminal device and the central office device;
   when the location of the FEC codeword input by a terminal decoder and corresponding to the data at the location of the time-frequency resource block is different from the location of the first FEC codeword:
      receiving a resynchronization request sent by the terminal device, and
      resending the synchronization information of the first FEC codeword to the terminal device by using the management channel.

6. The method according to claim 5, wherein the information about the location of the first FEC codeword corresponds to a first piece of data of the time-frequency resource block or indicates a boundary location of the first FEC codeword that is of the time-frequency resource block and corresponds to the data at the location of the time-frequency resource block, wherein the boundary location comprises a start or end location.

7. The method according to claim 5, wherein sending the synchronization information of the first FEC codeword to the terminal device by using the management channel comprises:
   sending a resource allocation indication message together with the synchronization information of the first FEC codeword by using the management channel, wherein the resource allocation indication message is used to indicate an allocation status parameter of a time-frequency resource block and comprises a resource allocation message, and the time-frequency resource block is the time-frequency resource block indicated in the resource allocation indication message.

8. A terminal device, comprising:
   an encoder;
   a decoder
   a receiver, configured to, after the terminal device initiates an access or registration request to a central office device:
      receive synchronization information that is of a first forward error correction (FEC) codeword sent by the central office device by using a management channel, wherein the synchronization information comprises information about a location, agreed to by the terminal device and the central office device, of the first FEC codeword and corresponding to data at a location, agreed to by the terminal device and the central office device, of a time-frequency resource block agreed to by the terminal device and the central office device, and receive the synchronization information of the first FEC codeword and resent by the central office device by using the management channel;

a transmitter, configured to send a resynchronization request message to the central office device; and at least one processor configured to execute instructions stored in at least one non-transitory memory to configure the terminal device to:

reset a status parameter of the decoder according to the synchronization information of the first FEC codeword, wherein the decoder starts decoding from the location of the first FEC codeword, or reset a status parameter of the encoder according to the synchronization information of the first FEC codeword, wherein the location of a FEC codeword output by the encoder and corresponding to the data at the location of the time-frequency resource block is the same as the location of the first FEC codeword, and reset status data of the encoder, wherein the location of the FEC codeword output by the encoder and corresponding to the data at the location of the time-frequency resource block is the same as the location of the first FEC codeword.

9. The terminal device according to claim 8, wherein the information about the location of the first FEC codeword corresponds to a first piece of data of the time-frequency resource block or indicates a boundary location of the first FEC codeword that is of the time-frequency resource block and corresponds to the data at the location of the time-frequency resource block, wherein the boundary location comprises a start or end location.

10. The terminal device according to claim 8, wherein receiving the synchronization information of the first forward error correction (FEC) codeword sent by the central office device by using the management channel comprises:

receiving the synchronization information of the first FEC codeword periodically sent by the central office device by using the management channel, wherein a period for sending the synchronization information of the first FEC codeword is an integral multiple of a frame period.

11. The terminal device according to claim 8, wherein receiving the synchronization information of the first forward error correction (FEC) codeword sent by the central office device by using the management channel comprises:

receiving a resource allocation indication message sent together with the synchronization information of the first FEC codeword by the central office device by using the management channel, wherein the resource allocation indication message is used to indicate an allocation status parameter of a time-frequency resource block and comprises a resource allocation message, and the time-frequency resource block is the time-frequency resource block indicated in the resource allocation indication message.

12. A central office device, comprising:

a transmitter, configured to, after a terminal device initiates an access or registration request to the central office device, send synchronization information of a first forward error correction (FEC) codeword to the terminal device using a management channel, wherein the synchronization information comprises information about a location, agreed to by the terminal device and the central office device, of the first FEC codeword and corresponding to data at a location, agreed to by the terminal device and the central office device, of a time-frequency resource block agreed to by the terminal device and the central office device; and a receiver, configured to receive a resynchronization request sent by the terminal device when the location of the FEC codeword input by a terminal decoder and corresponding to the data at the location of the time-frequency resource block is different from the location of the first FEC codeword;

wherein the transmitter is further configured to resend the synchronization information of the first FEC codeword to the terminal device by using the management channel.

13. The central office device according to claim 12, wherein the information about the location of the first FEC codeword corresponds to a first piece of data of the time-frequency resource block or indicates a boundary location of the first FEC codeword that is of the time-frequency resource block and corresponds to the data at the location of the time-frequency resource block, wherein the boundary location comprises a start or end location.

14. The central office device according to claim 12, wherein sending the synchronization information of the first forward error correction (FEC) codeword to the terminal device by using the management channel comprises:

sending a resource allocation indication message together with the synchronization information of the first FEC codeword by using the management channel, wherein the resource allocation indication message is used to indicate an allocation status parameter of a time-frequency resource block and comprises a resource allocation message, and the time-frequency resource block is the time-frequency resource block indicated in the resource allocation indication message.

15. A forward error correction codeword synchronization system, comprising:

a terminal device, configured to, after the terminal device initiates an access or registration request to a central office device:

receive synchronization information that is of a first forward error correction (FEC) codeword sent by the central office device by using a management channel, wherein the synchronization information comprises information about a location, agreed to by the terminal device and the central office device, of the first FEC codeword and corresponding to data at a location, agreed to by the terminal device and the central office device, of a time-frequency resource block agreed to by the terminal device and the central office device;

reset a status parameter of a terminal decoder according to the synchronization information of the first FEC codeword, or reset a status parameter of a terminal encoder according to the synchronization information of the first FEC codeword;

send a resynchronization request message to the central office device;

receive the synchronization information of the first FEC codeword and resent by the central office device by using the management channel; and reset status data of the terminal encoder, wherein the location of the FEC codeword output by the terminal encoder and corresponding to the data at the location of the time-frequency resource block is the same as the location of the first FEC codeword; and the central office device, configured to, after the terminal device initiates the access or registration request to the central office device:

send synchronization information of the first FEC codeword to the terminal device by using a management channel;

receive a resynchronization request sent by the terminal device, when the location of the FEC codeword input by a terminal decoder and corresponding to the data at the location of the time-frequency resource block is different from the location of the first FEC codeword; and resend the synchronization information of the first FEC codeword to the terminal device by using the management channel.

* * * * *